United States Patent [19]
Lee

[11] Patent Number: 5,457,455
[45] Date of Patent: Oct. 10, 1995

[54] REAL TIME KEYBOARD SCANNER

[75] Inventor: Wai-Tak P. Lee, Fountain Valley, Calif.

[73] Assignee: Rockwell International Corporation, Seal Beach, Calif.

[21] Appl. No.: 948,515

[22] Filed: Sep. 22, 1992

[51] Int. Cl.$^6$ .................................................. H03M 11/00
[52] U.S. Cl. ............................... 341/24; 341/26; 364/189
[58] Field of Search ..................... 341/24, 26; 364/189, 364/900

[56] References Cited

U.S. PATENT DOCUMENTS

| Re. 31,736 | 11/1984 | Mueller et al. | 364/900 |
|---|---|---|---|
| 3,743,755 | 7/1973 | Watson . | |
| 3,886,543 | 5/1975 | Marin | 341/24 |
| 3,936,828 | 2/1976 | Muesse et al. . | |
| 3,973,256 | 8/1976 | Stoesser et al. | 341/24 |
| 4,100,606 | 7/1978 | Brantingham | 341/24 |
| 4,339,134 | 7/1982 | Macheel | 364/900 |
| 5,285,495 | 2/1994 | Wu et al. | 341/26 |

Primary Examiner—John K. Peng
Assistant Examiner—Daniel J. Wu
Attorney, Agent, or Firm—George A. Montanye; David J. Arthur; Tom Streeter

[57] ABSTRACT

The REAL TIME KEYBOARD SCANNER shown herein provides scanning and debouncing, but not multiple key resolution or buffering. At the end of each keyboard scan, the scanner produces a code indicating which key was depressed, or that no key was depressed, or that multiple keys were depressed. If this code is the same as the code in a valid-key register, then no change is made to the valid-key register and no debouncing is performed. If the codes differ, then debouncing is performed. The CPU served by the scanner can examine the code in the valid-key register whenever it finds such examination to be convenient, and need not tie up valuable processing time in continuously monitoring the valid-key register. If desired, an interrupt may be sent to the CPU when the code in the valid-key register is changed.

8 Claims, 15 Drawing Sheets

PREVIOUS SCAN STATUS BITS

|  | 00 | 01 | 10 | 11 |
|---|---|---|---|---|
| 00 | COUNT | LOAD | LOAD | LOAD |
| 01 | LOAD | LOAD | LOAD | LOAD |
| 10 | LOAD | COUNT | COUNT | LOAD |
| 11 | LOAD | LOAD | LOAD | COUNT |

CURRENT SCAN STATUS BITS

REAL TIME KEYBOARD SCANNER

BACKGROUND OF THE INVENTION

A computer typically is not required to receive data from a keyboard and to simultaneously process data previously received. The central processing unit (CPU) is therefore toggled between these two tasks. The CPU, when receiving data from the keyboard, is sophisticated enough to provide such functions as scanning, debouncing, multiple key resolution, buffering, and the like.

In some applications, data must be input while the CPU is processing other data. It is possible to force the CPU to a halt, but it is better to upgrade the keyboard (sometimes by including an entire second CPU) to provide these functions. However, this is expensive. More importantly, the primary CPU is removed from real time communication with the keyboard.

SUMMARY OF THE INVENTION

It is an object of the present invention to overcome these limitations by providing a keyboard scanner which provides scanning and debouncing, but not multiple key resolution or buffering. At the end of each keyboard scan, the scanner produces a code indicating which key was depressed, or that no key was depressed, or that multiple keys were depressed. If this code Is the same as the code in a valid-key register, then no change is made to the valid-key register and no debouncing is performed. If the codes differ, then debouncing is performed.

Debouncing requires that the same code be produced by the scanner for a pre-selected number of scans. If and when this happens, the code produced by the scanner replaces the code in the valid-key register. Until that time, no change is made to the code in the valid-key register.

The CPU served by the scanner can examine the code in the valid-key register whenever it finds such examination to be convenient, and need not tie up valuable processing time in continuously monitoring the valid-key register. If desired, an interrupt may be sent to the CPU when the code in the valid-key register is changed.

DETAILED DESCRIPTION OF THE DRAWINGS

Figure 1:
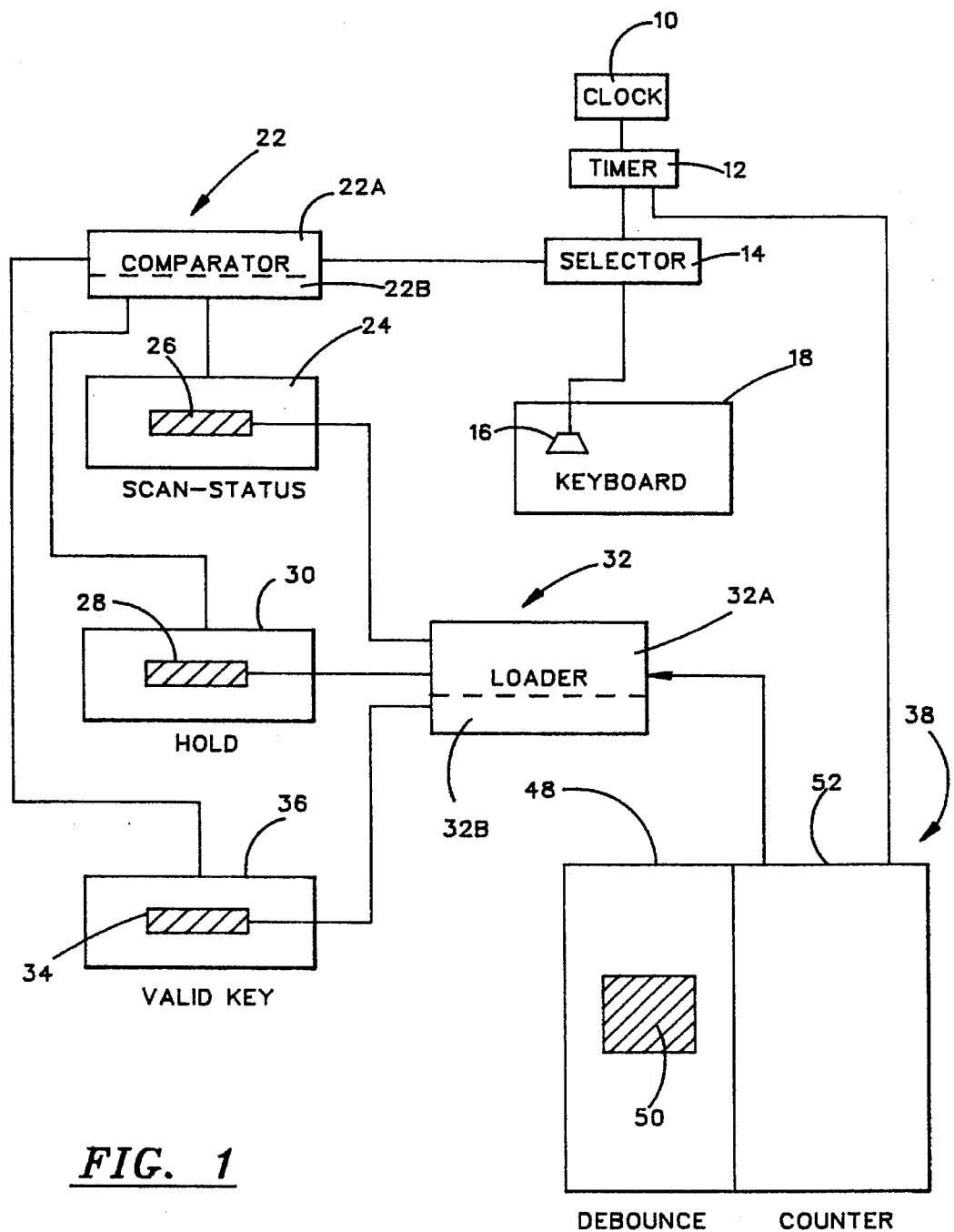
FIG. 1 is a block diagram of the present invention.

In FIG. 1, a system clock 10 drives a timer 12 to strobe a selector 14. The number of clock pulses per strobe is a design choice. The selector 14 selects the next key 16 of the keyboard 18 to be scanned for being either depressed or released. If the key 16 under consideration is depressed, the selector 14 loads a key-code 20 indicative of this key 16 into a comparator 22. The choice of which electronic key-code 20 is to be associated with which physical key 16 is made according to what the design engineer finds convenient. ASCII is conventional in the industry. Conventional keyboards use conventional methods for converting the depression of a physical key into a raw electronic signal, ready for further processing. Any of these methods, or a novel method (if desired), may be used in the selector 14 to generate the key-code 20 for further processing.

The comparator 22 drives a scan-status register 24. The scan-status register 24 contains a two-bit scan-status code 26. The scan-status code 26 is initially set to 00, when the scan of the keyboard 18 is begun. A scan-status code 26 of 00 indicates that no depressed key 16 has yet been detected during this scan of the keyboard 18, that is, that no key-code 20 has yet been loaded into the comparator 22.

When the comparator 22 is loaded with a key-code 20, it checks the scan-status code 26. The next action depends on whether the scan-status code 26 is still 00.

If the scan-status code 26 is still 00, then the comparator 22 compares the key-code 20 with the hold-code 28 located in a holding register 30. If the key-code 20 and hold-code 28 differ, then the scan-status code 26 is changed to 01, indicating that a single key has been depressed, but that it is different from the key of the previous scan. If the key-code 20 and hold-code 28 are the same, then the scan-status code 26 is changed to 10, indicating that a single key has been depressed, and that it is the same as the key of the previous scan. In either case, the hold-code 28 is replaced by the key-code 20.

If the scan-status code 26 is not 00, this indicates that multiple depressed keys 16 have been detected during this scan of the keyboard 18. It is not necessary to compare the key-code 20 and the hold-code 28. It is necessary only for the comparator to load a 11 into the scan-status register 24, indicating multiple depressed keys 16.

The particular scan-status codes 26 stated are preferred, but other codes may be used if desired.

At the end of the keyboard scan, a loader 32 examines the scan-status register 24. If the scan-status code 26 is a 00, the loader 32 loads a hold-code 01 into the holding register 30. If the scan-status code 26 is a 11, the loader 32 loads a hold-code 02 into the holding register 30. The key-codes 20 have previously been structured so as to not produce a 01 or 02 in response to any depressed key 16, in order to allow the holding register 30 to perform this additional duty.

The comparator 22 then compares the hold-code 28 in the holding register 30 with the valid-key code 34 located in a valid-key register 36. (If desired, two comparators may be provided, one for comparing the key-code 20 with the hold-code 28, and the other for comparing the hold-code 28 with the valid-key code 34. The choice between single and dual comparators is for the design engineer.) The comparator 22 is therefore shown as optionally divided by a dotted line into a first comparator 22A and a second comparator 22B. If the codes 28 and 34 are the same, then no change is made to the valid-key code 34, and debouncing is omitted. If they differ, debouncing must be performed before the valid-key code 34 is replaced with the hold-code 28.

A debounce counter 38 counts the number of consecutive keyboard scans in which the same single key 16 is detected. This is conveniently accomplished by dividing the scan-status register 24 into two fields.

Figures 2, 3:
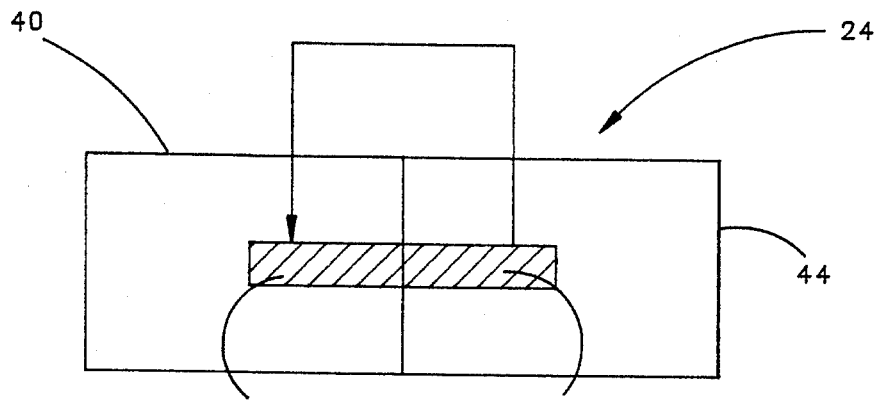
FIG. 2 is a detailed block diagram of the scan-status register shown in FIG. 1.
FIG. 3 is a decision matrix showing the operation of the debounce counter shown in FIG. 1.

In FIG. 2, the two fields of the scan-status register 24 are shown. A current-scan field 40 contains a current-scan code 42, and a previous-scan field 44 contains a previous-scan code 46. At the end of each keyboard scan, the current-scan code 42 is transferred into the previous-scan field 44 by shifting. This action destroys the previous-scan code 46 and makes room for the next keyboard scan to load a new current-scan code 42 into the current-scan field 40. Immediately before this action, the status of both the current and the previous scans are available to the debounce counter.

Returning to FIG. 1, the debounce counter 38 includes a debounce-hold register 48 containing a debounce-hold code 50, and a down counter 52. With each strobe of the timer 12, the down counter 52 is decremented by one. If the down counter 52 holds a 00, and therefore cannot be further decremented, the hold-code 28 in the holding register 30 is loaded into the valid-key register 36 by the loader 32. A pre-selected loading initiator other than 00 may be used if desired. The loader 32 is therefore shown as optionally divided by a dotted line into a first loader 32A and a second loader 32B. Likewise, as with the comparator 22, separate loaders 32 may be provided if desired.

If, however, the appropriate combination of the current-scan code 42 and previous-scan code 46 indicates that a bounce has occurred, then the down counter 52 is not decremented but is, instead, loaded with the debounce-hold code 50. The size of the debounce-hold code 50 is a design choice. It is set low when the keyboard 18 must be rapid, and is set high when bounces must be reliably rejected.

When both the current scan and the previous scan indicate that no key 16 has been depressed, the down counter 52 should be decremented. The same is true when both the current scan and the previous scan indicate that multiple keys 16 have been depressed.
Further,
(a) the current scan indicates that a single key 16 has been depressed, and that this key is the same as that depressed during the previous scan; and
(b) the previous scan indicates that a single key 16 has been depressed, regardless of whether this key is the same as that depressed during the scan before that;
then a truly valid key 16 has been detected, and the down counter 52 should be decremented. In all other cases, the down counter 52 should be re-initialized by loading it with the debounce-hold code 50.

FIG. 3 shows the foregoing decision matrix.

Upon power-on, the valid-key code 34 is set to 01; that is, it is placed in the state which it would have attained if there had been many scans of the entire keyboard 18 without detecting a single depressed key 16. Thus, if there in fact is no depressed key 16 for several scans after power-on, the hold-code 28 will also attain a value of 01, and there will be no updating to the valid-key code 34. This is particularly important when such an update is structured to cause an interrupt to the CPU served by the keyboard 18.

The particular hold-codes 28 and matching valid-key codes 34 stated are preferred, but other matching codes may be used if desired.

Figure 4:
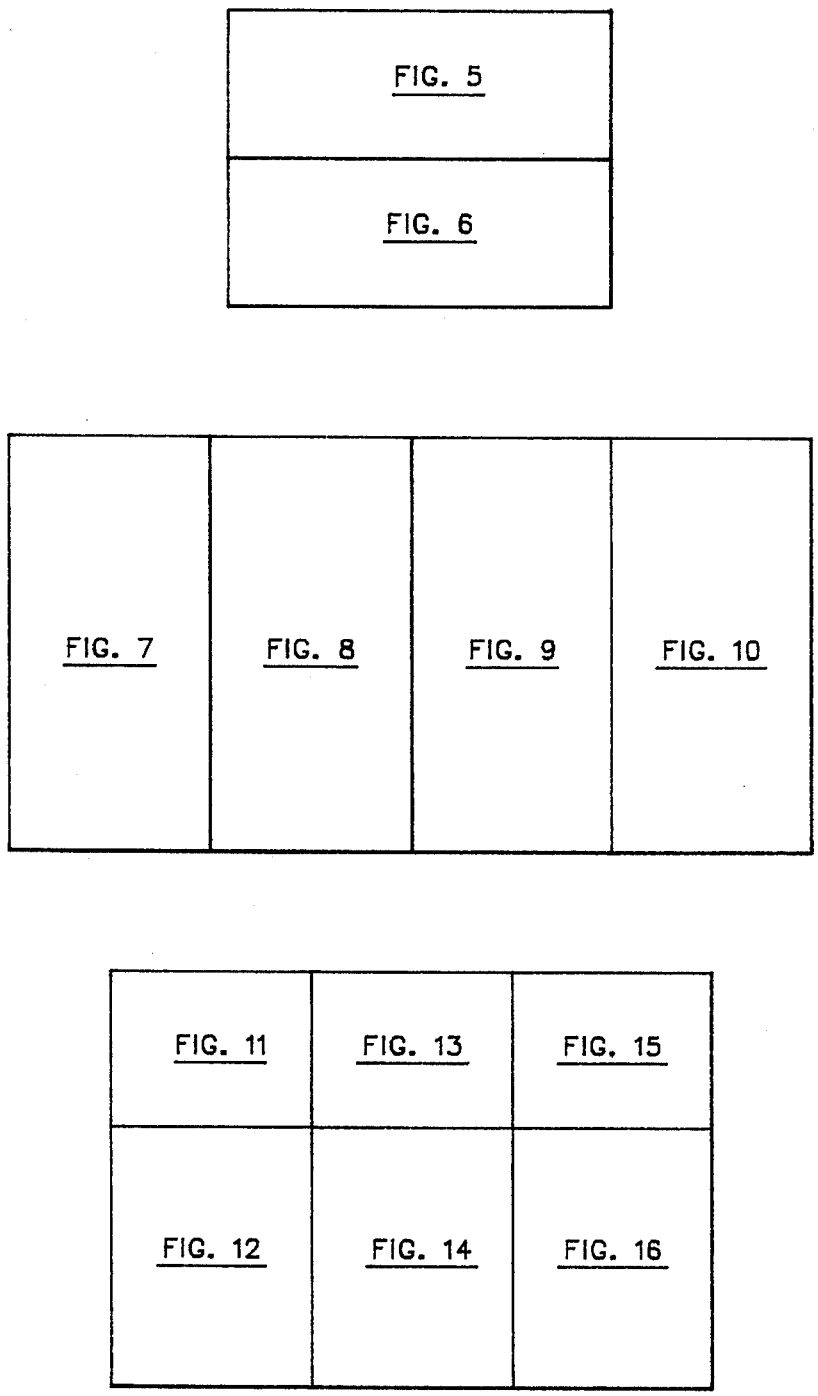
FIG. 4 is a diagram showing how FIGS. 5 and 6 fit together, how FIGS. 7–10 fit together, and how FIGS. 11–16 fit together.
Figure 5:
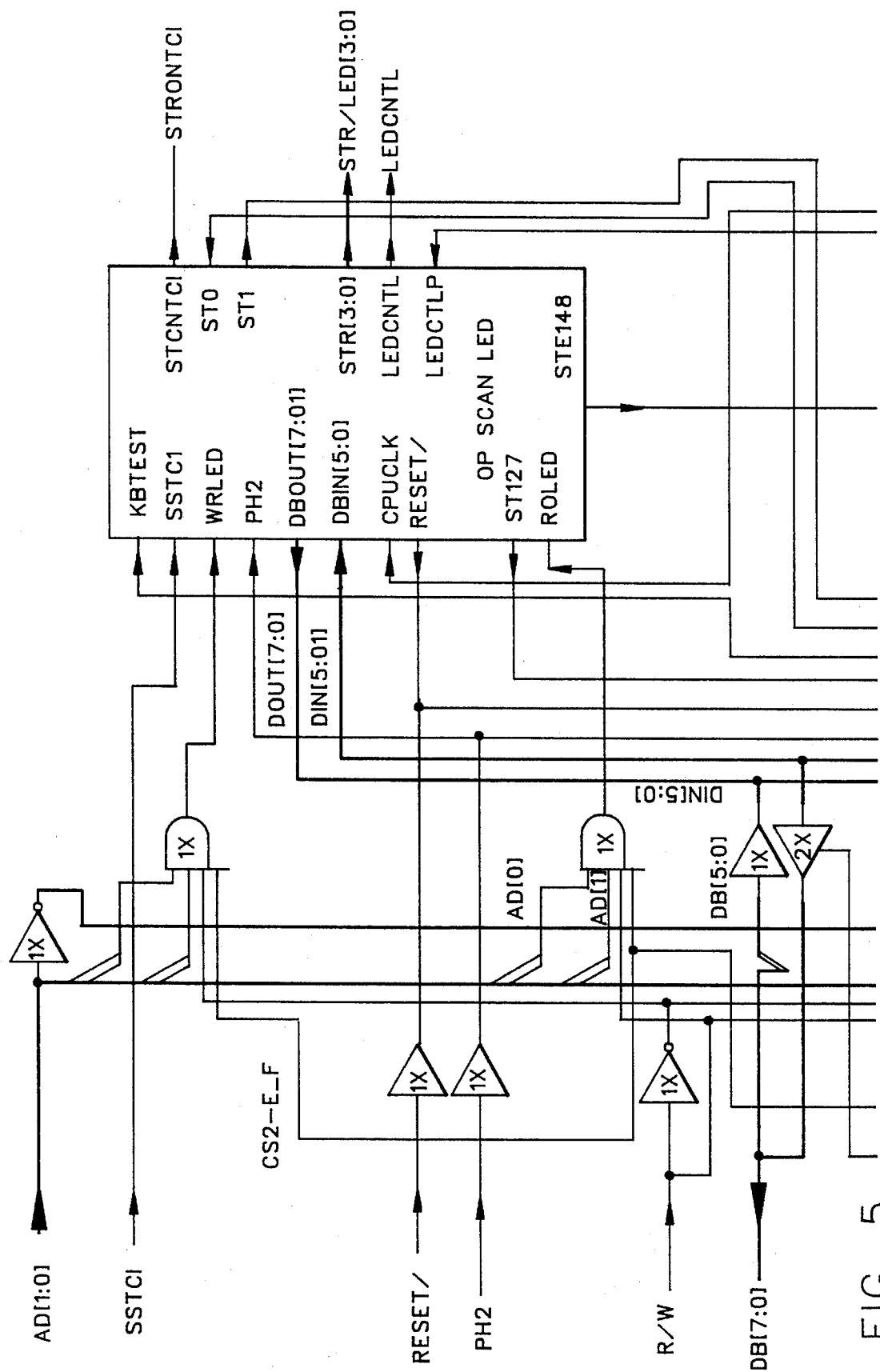
FIGS. 5–16 are detailed schematic diagrams of a preferred embodiment of the present invention.
Figure 6:
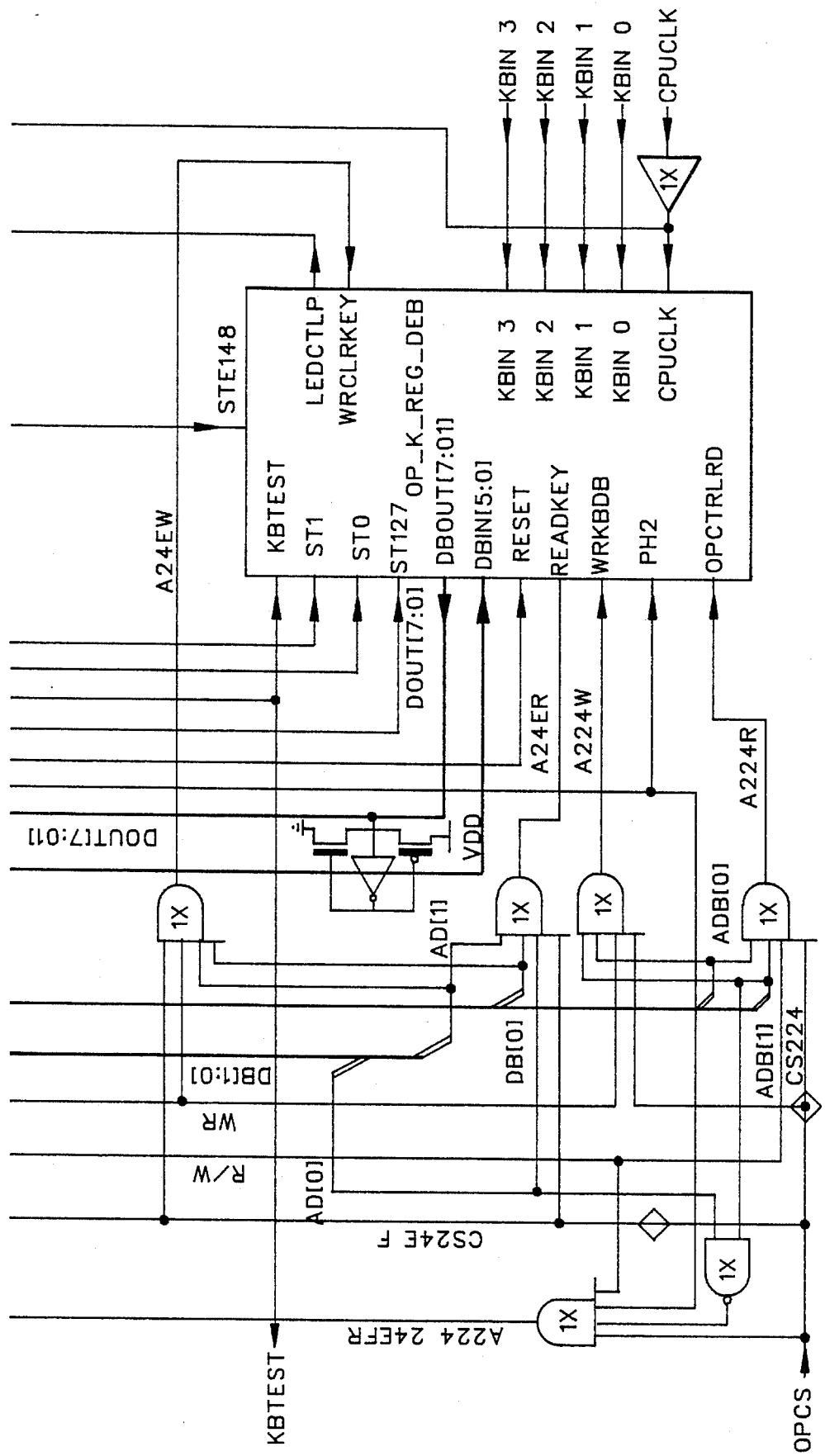
Figure 7:
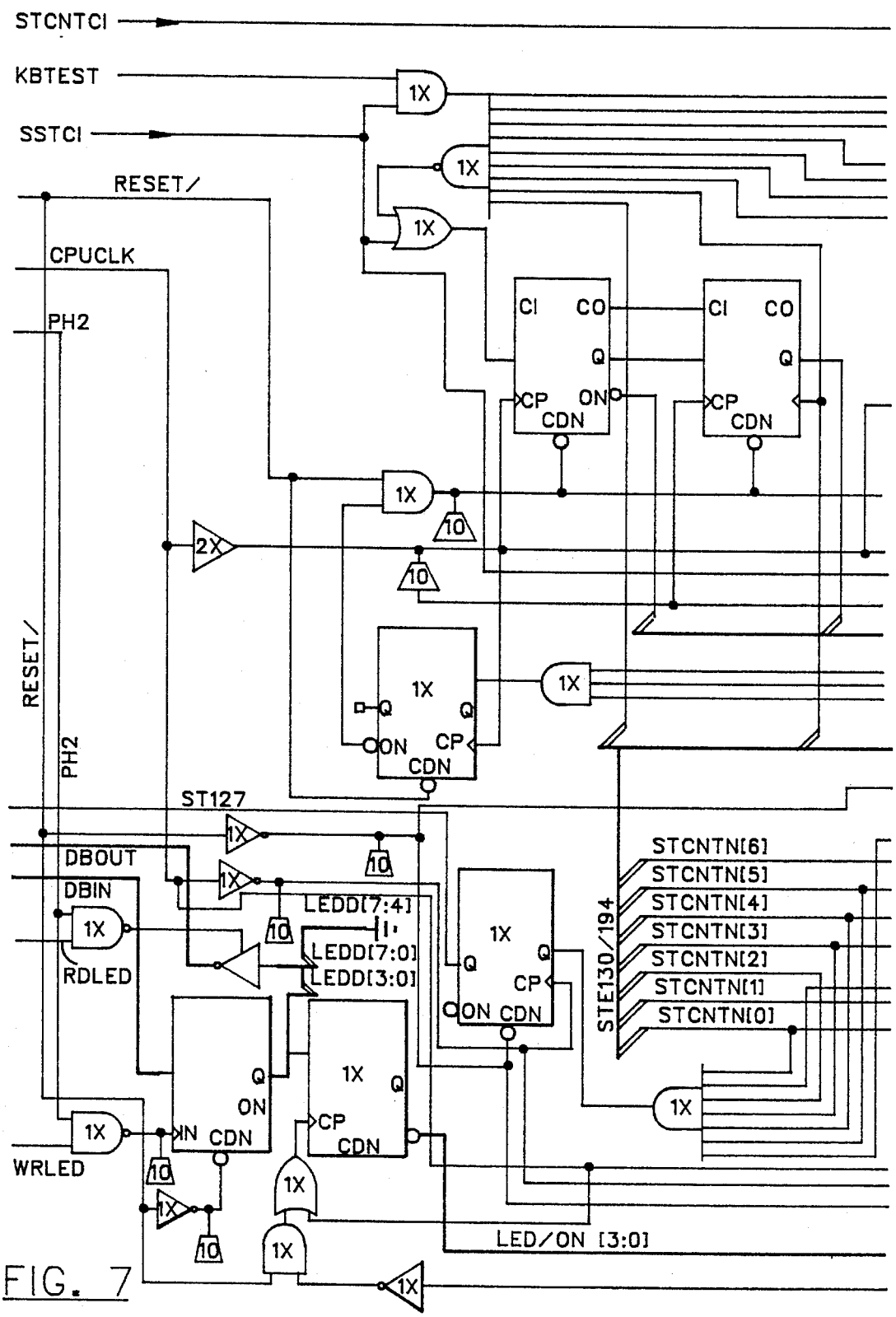
Figure 8:
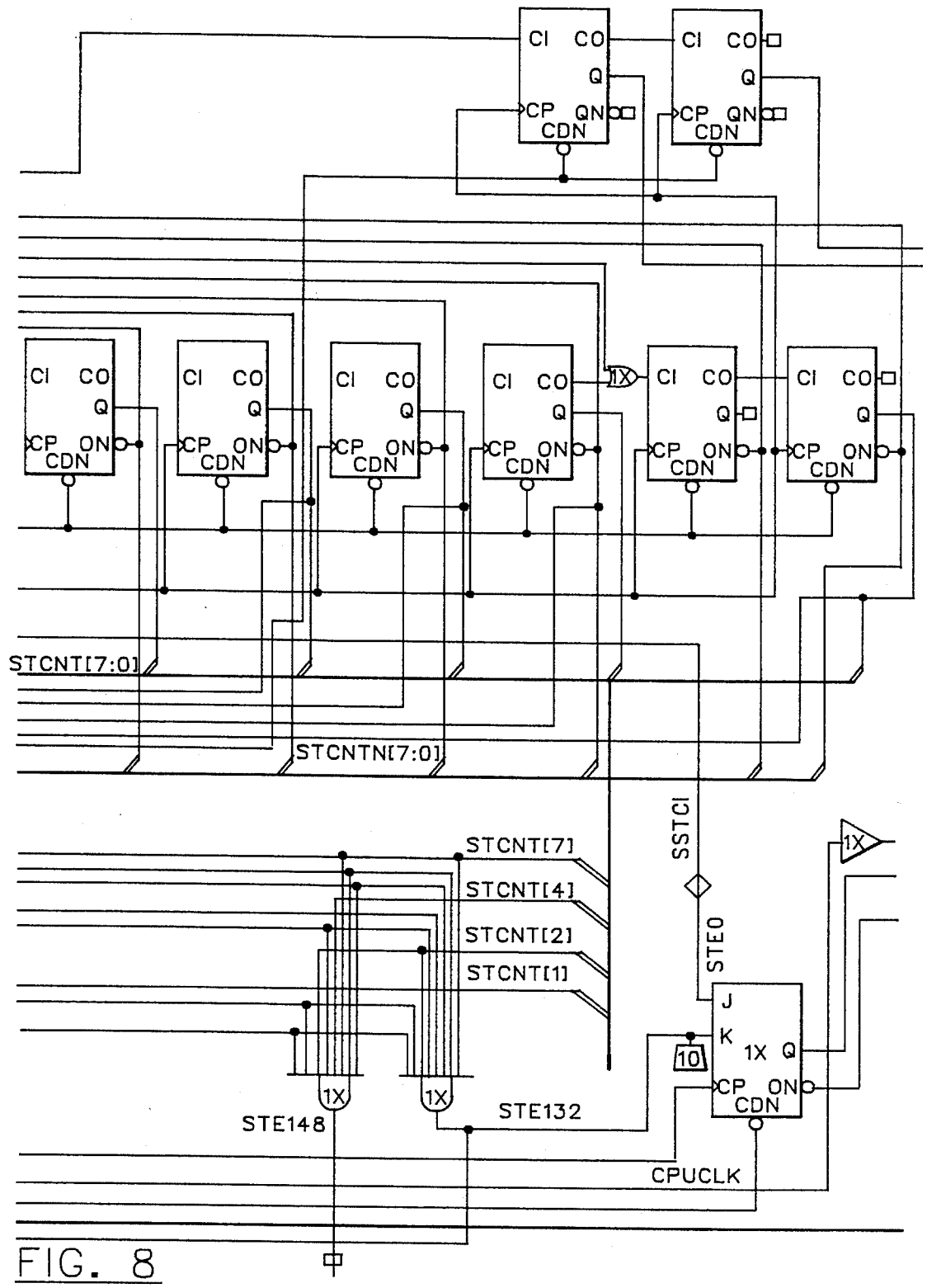
Figure 9:
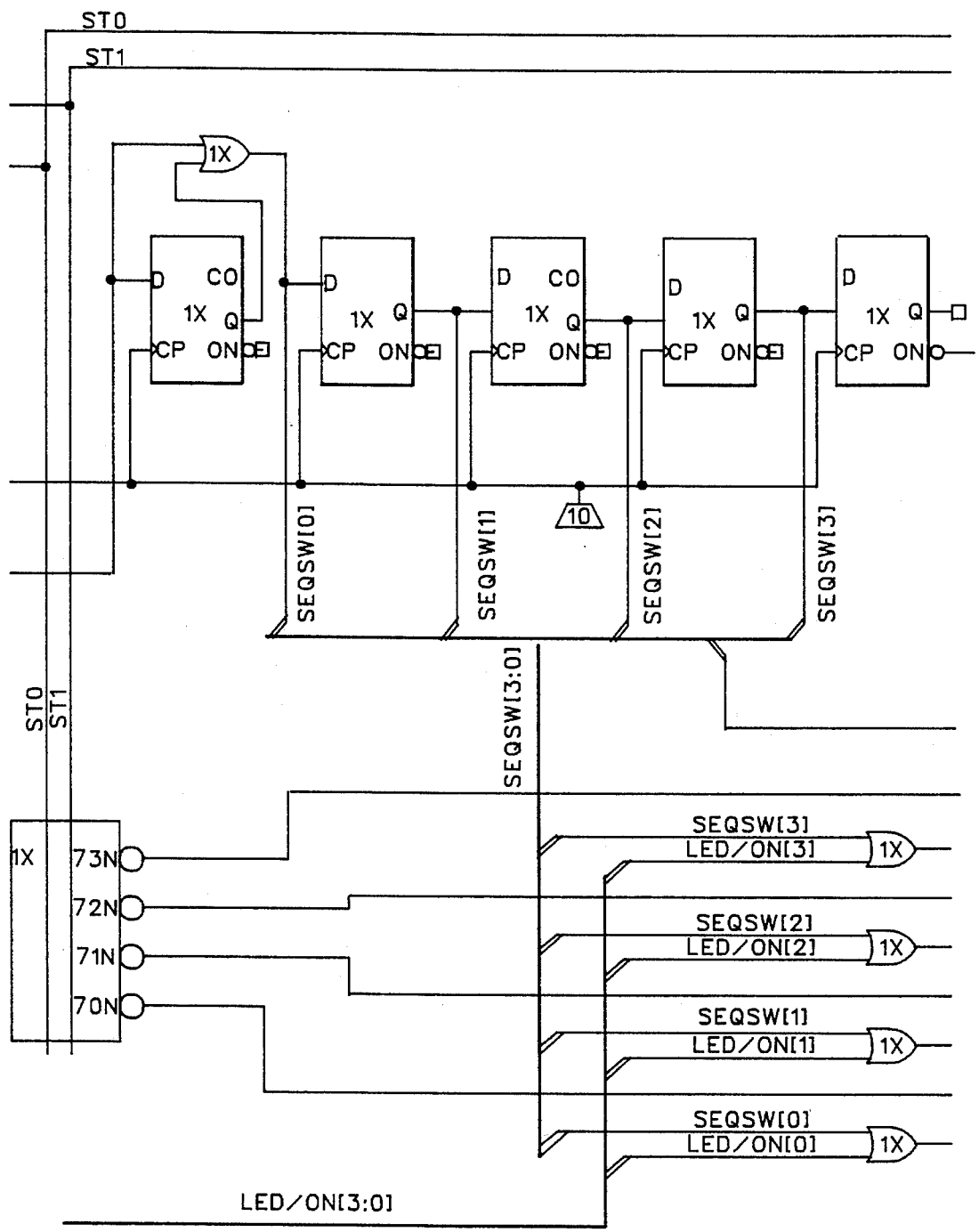
Figure 10:
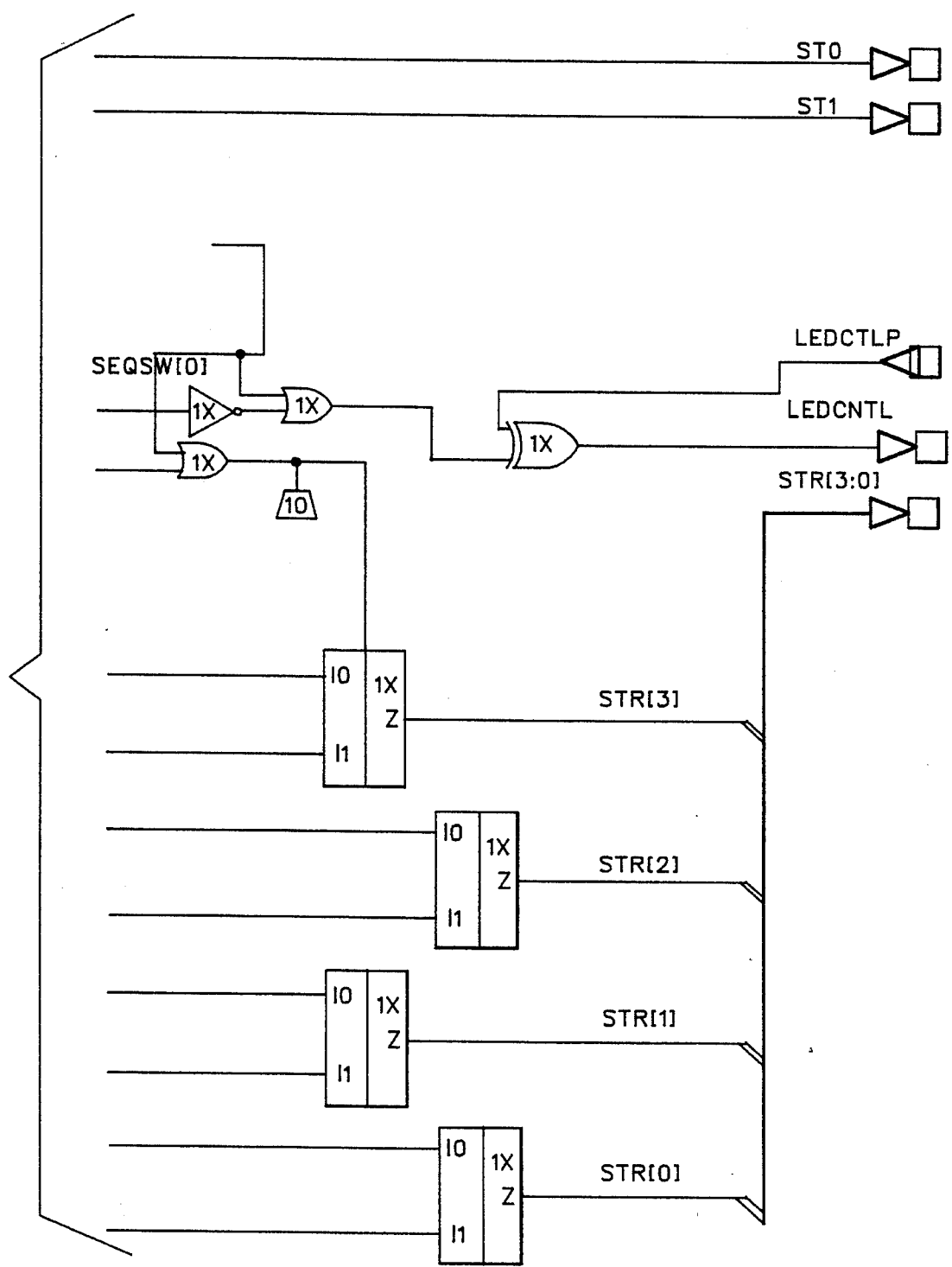
Figure 11:
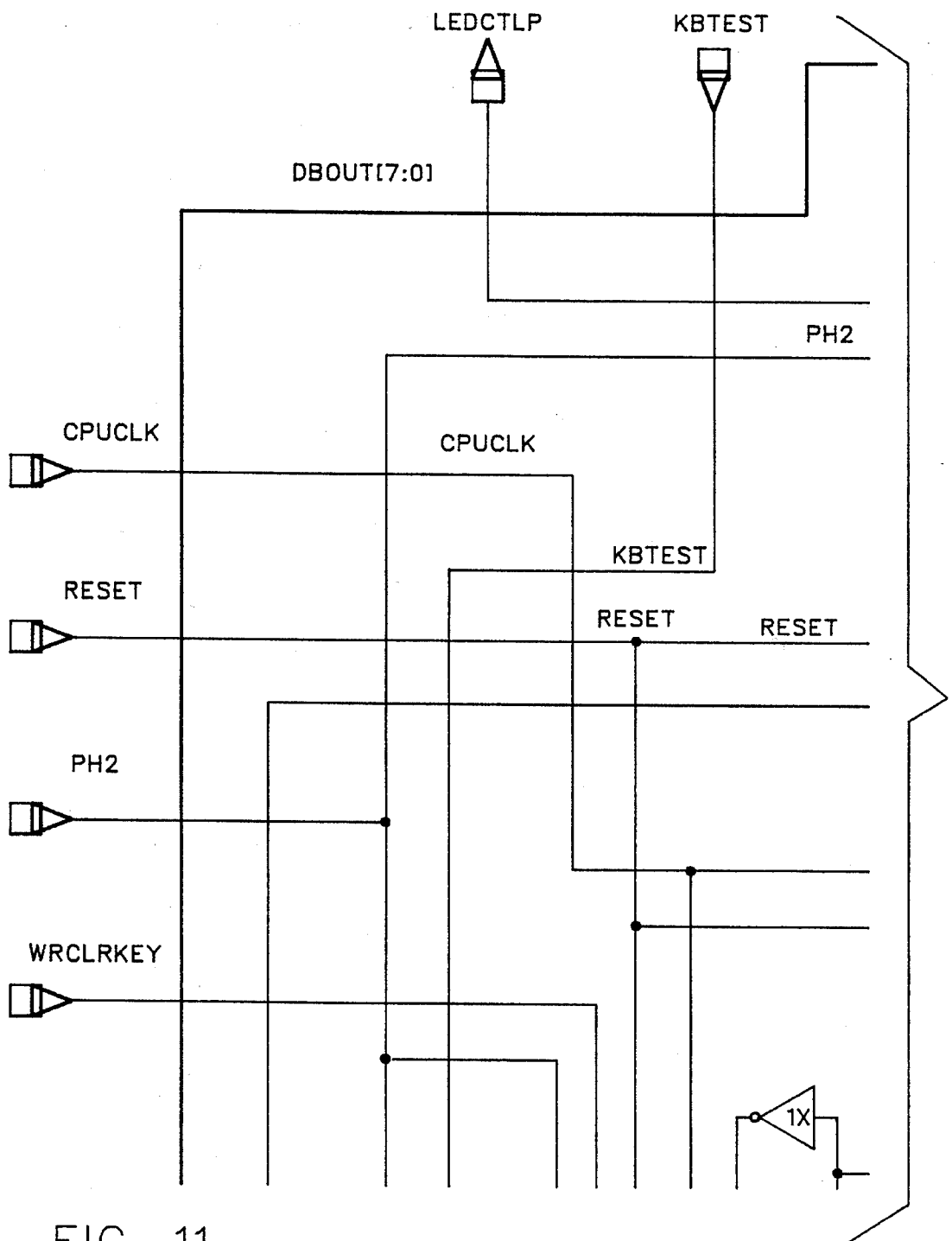

FIGS. 4, 5, and 6 are schematics of a particular embodiment of the apparatus described above, and require no further explanation.

Figure 12:
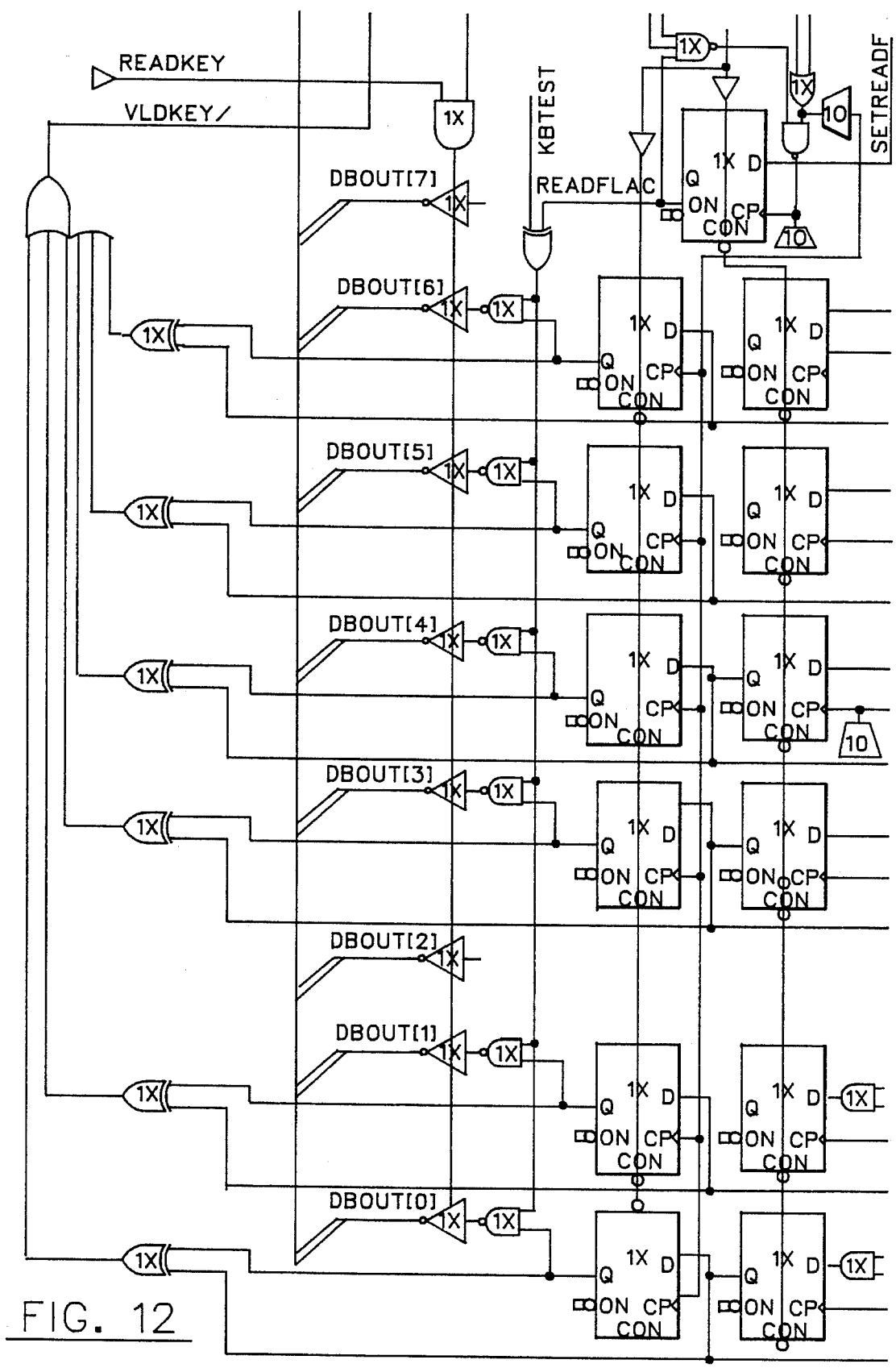
Figure 13:
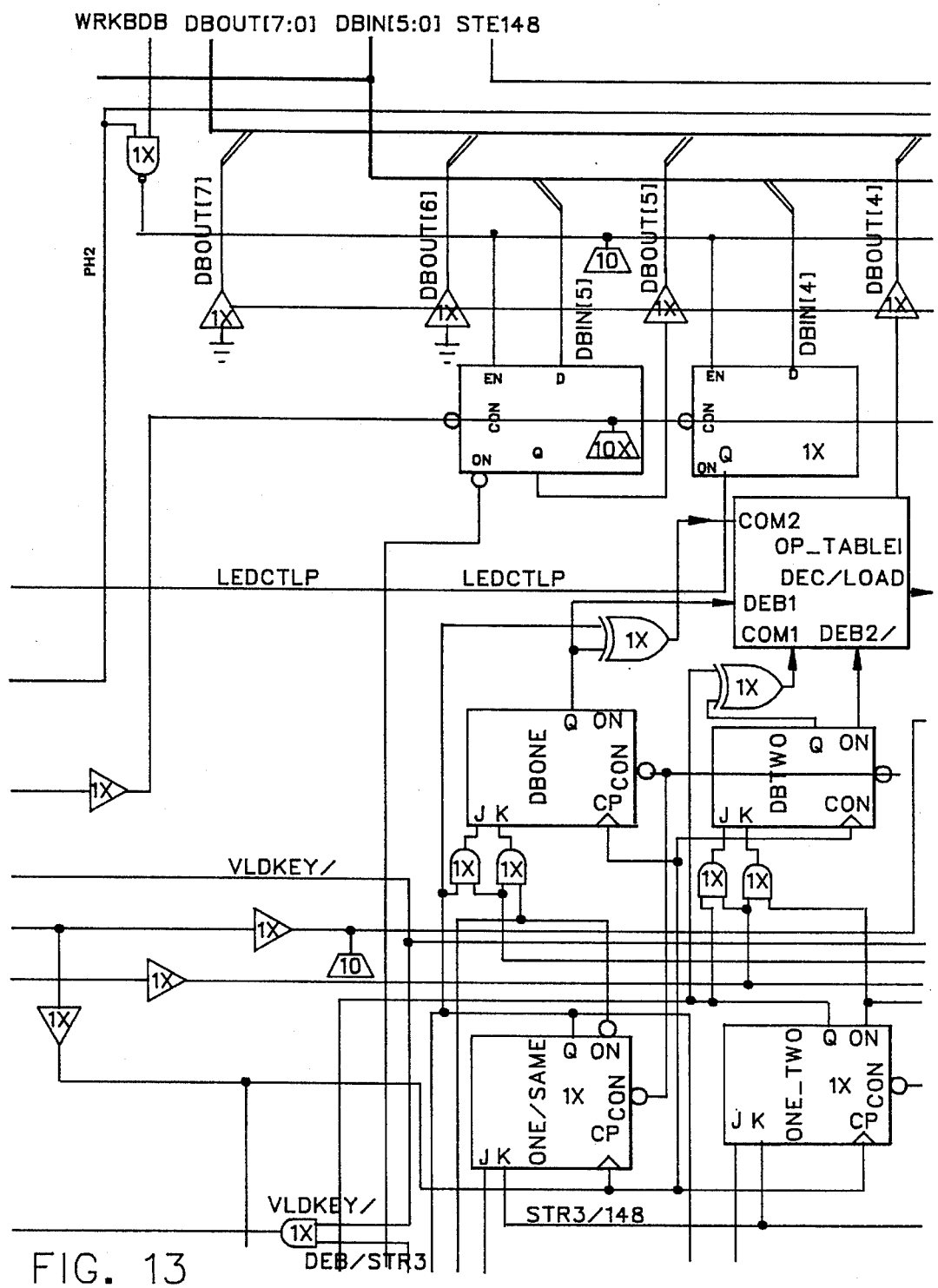
Figure 14:
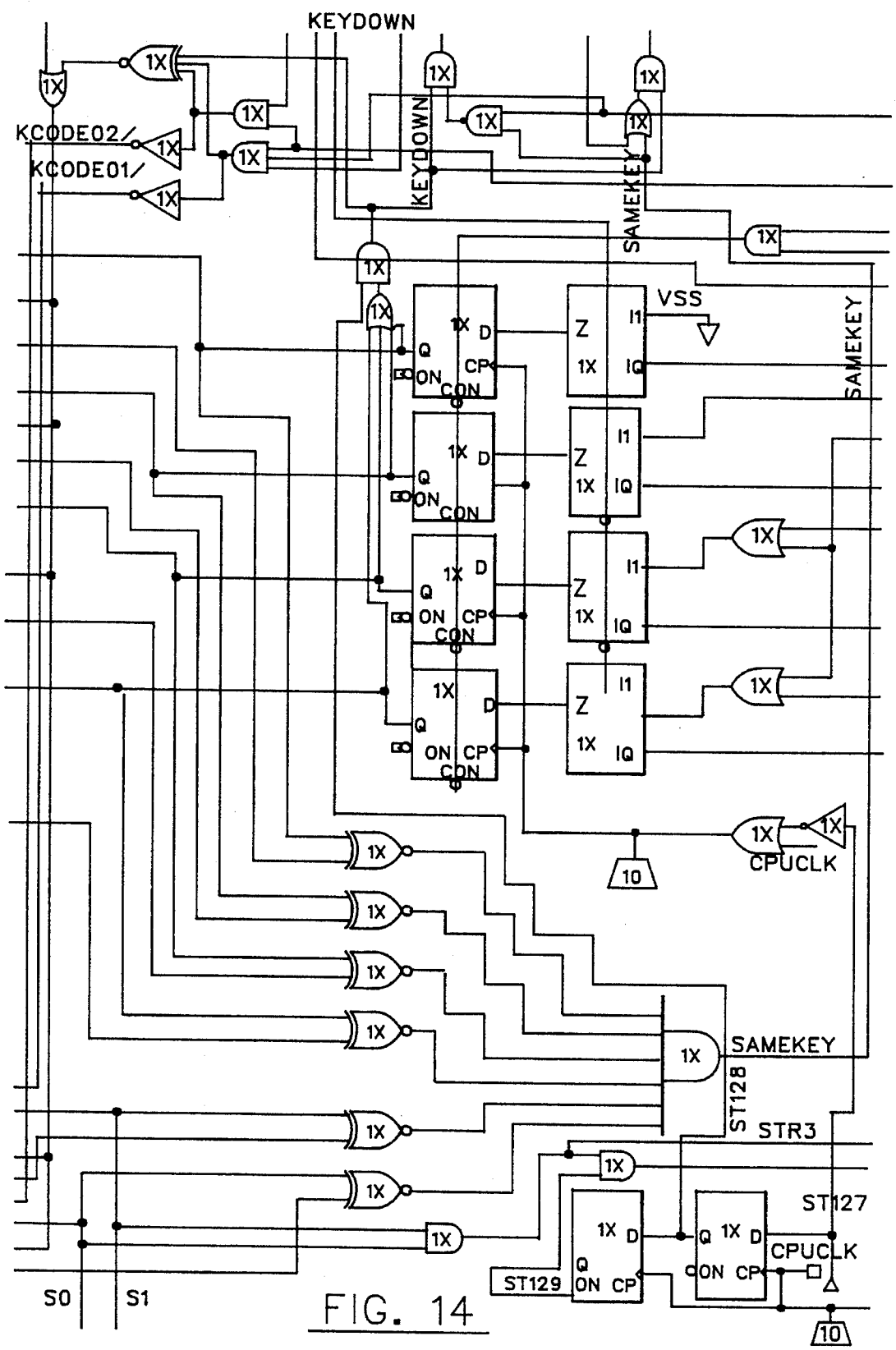
Figure 15:
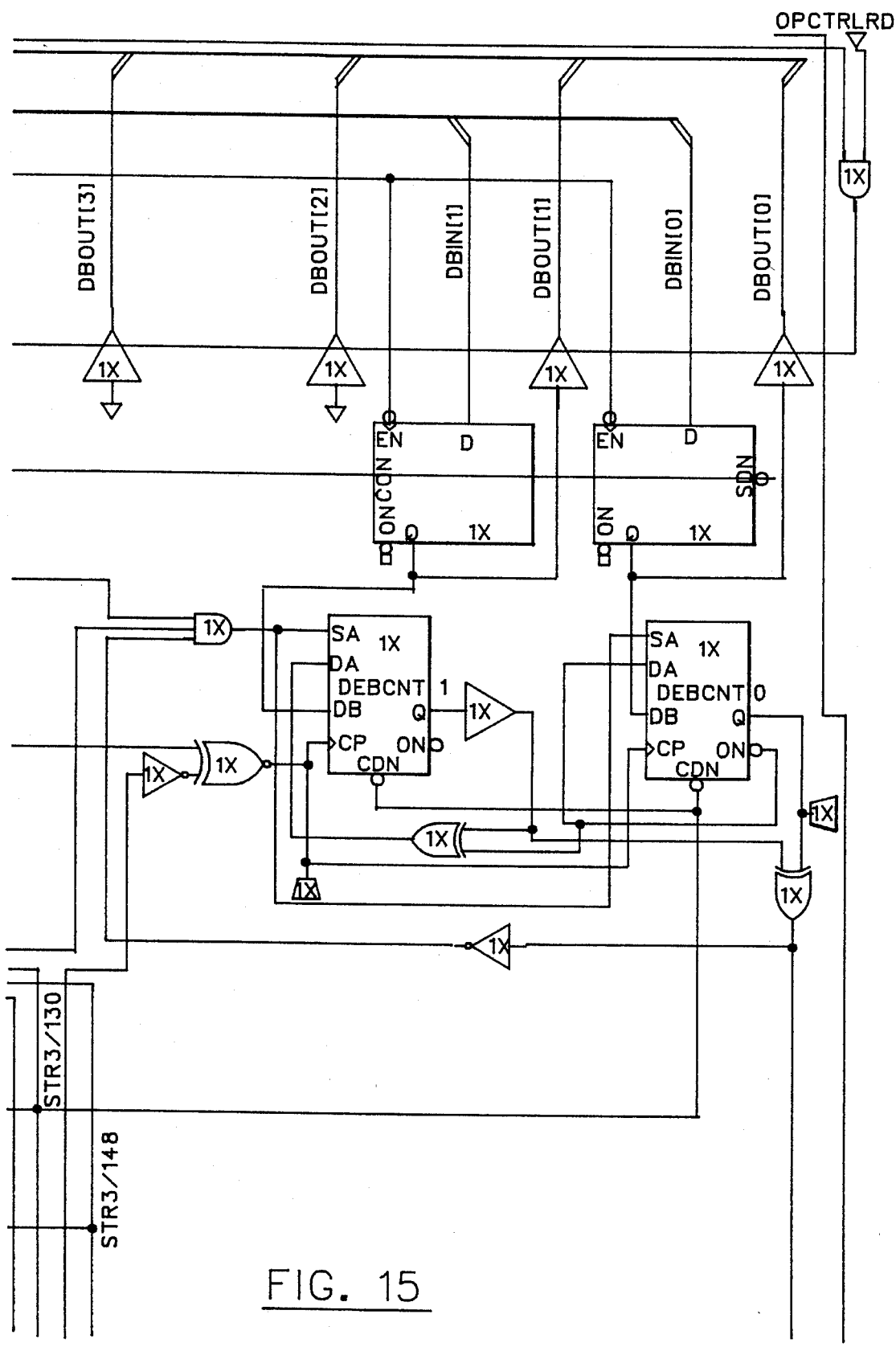
Figure 16:
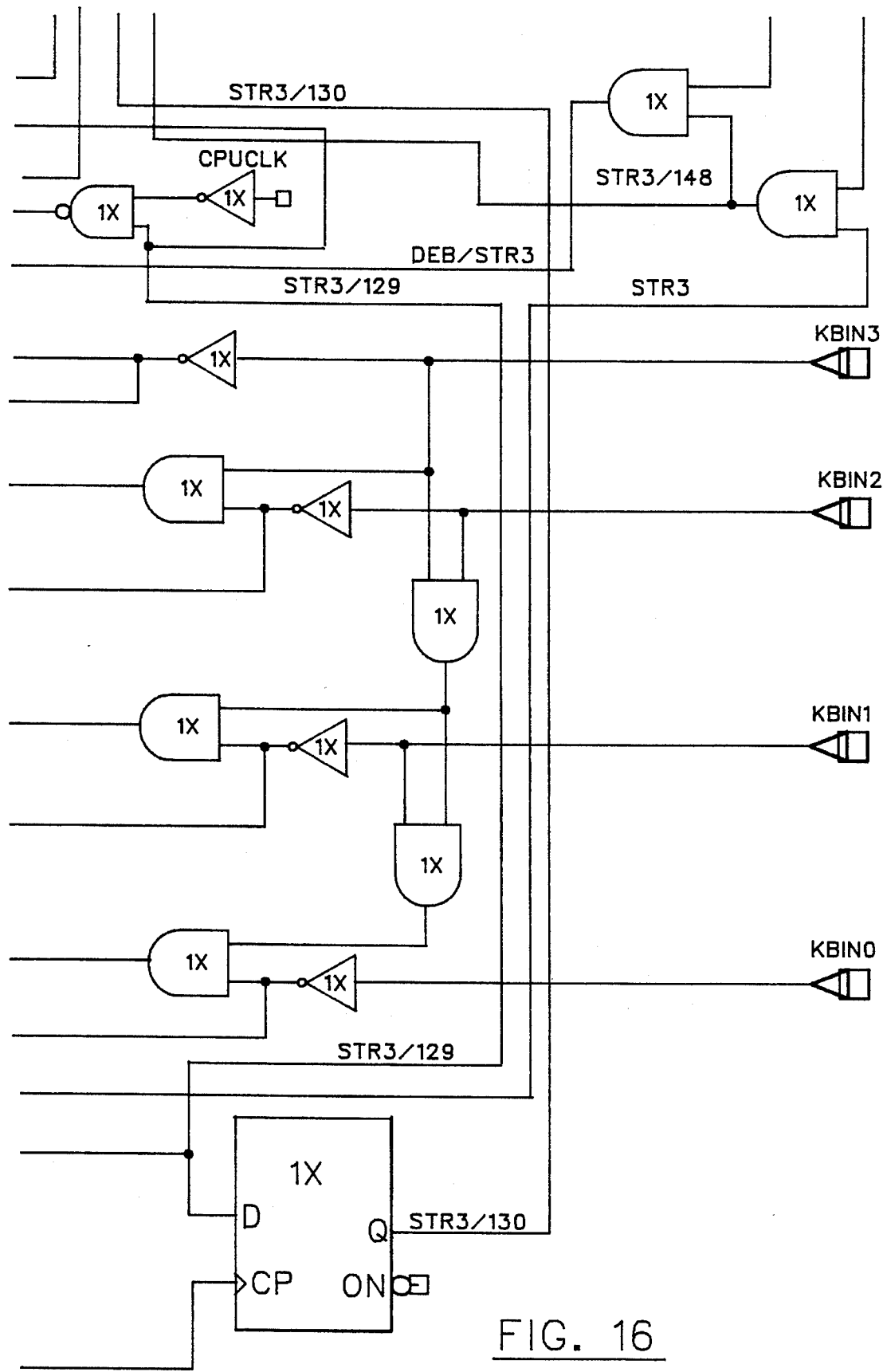

As noted above, comparator 22 (see FIG. 1) is conveniently mechanized as a first comparator 22A and second comparator 22B. FIGS. 12 and 14 describe this in more detail. In FIG. 12, in the upper left corner, the VLDKEY line acts as first comparator 22A between the contents 34 of the valid key register 36, and the contents 28 of the holding register 30. In FIG. 14, in the lower right corner, the SAMEKEY line acts as second comparator 22B between the contents 26 of the scan-status register 24, and the contents 28 of the holding register 30.

Also as noted above, loader 32 (see FIG. 1) is conveniently mechanized as a first loader 32A and second loader 32B. FIGS. 12 and 14 describe this in more detail as well. In FIG. 14, in the upper left corner, the KEYCODE01 and KEYCODE02 lines act as first loader 32A between the contents 26 of the scan-status register 24, and the contents 28 of the holding register 30. In FIG. 12, in the upper right corner, the READFLAG line acts as second loader 32B between the contents 34 of the valid key register 36, and the contents 28 of the holding register 30.

The VLDKEY signal (or line) is the output (or result) of the first comparator 22A; so is the signal, SAMEKEY, which is the result of the second comparator 22B. The first loader, 32A, is mechanized by the ISEYDOWN and the buffered puclk signals. The second loader, 32B, is mechanized by the signal SetReadF and the puclk. The READFLAG signal is to enable/gate the contents of the VALIDKEY register to the data 22 bus. The KEYCODE01 and KEYCODE02 are the signals which set the keycodes to 01 and 02 respectively when the second loader, 32B, is loading the holding register.

The apparatus described above thus interfaces with a CPU through a single valid-key register. This register does not change until enough scans of the keyboard have been made, with identical results, to indicate that no bouncing has taken place. Separate valid-key codes are set aside for the conditions of no key having been depressed, or of multiple keys having been depressed. A single code is used for the depression of multiple keys. No attempt is made to indicate that one set of multiple keys was depressed during the previous scan and that another set was depressed during the current scan. No attempt is made to buffer a rapidly changing sequence of single keys. Indeed, no attempt is made to determine which key of a rapidly changing sequence of single keys was depressed first.

INDUSTRIAL APPLICABILITY

The present invention is capable of exploitation in industry, and can be used, whenever it is desired to provide an inexpensive, real-time keyboard scanner which places minimal demands on the CPU which It drives. It can be made from components which, taken separate and apart from one another, are entirely conventional, or it can be made from their nonconventional counterparts.

While a preferred embodiment of the present invention has been described in detail, the true scope and spirit of the present invention are not limited thereto, but are limited only by the following claims.

What is claimed is:

1. A keyboard scanner, comprising:
(a) a selector constructed and connected to select a next key of the keyboard, and, if the key is depressed, to produce a key-code indicative of the key;
(b) a first comparator constructed and connected:
  (1) to receive the key-code from the selector and to compare it with a hold-code in a holding register;
  (2) if, upon the comparator's receipt of the key-code, a scan-status code in a scan-status register indicates "no key has yet been depressed", to change the hold-code to the key-code, and to change the scan-status code to:
    (A) "single key depressed, same as last scan" if the key-code and the hold-code are the same; and
    (B) "single key depressed, different from last scan" if the key-code and the hold-code are different: and
  (3) if, upon the comparator's receipt of the key-code, the scan-status code does not indicates "no key has yet been depressed", to change the scan-status code to "multiple keys have been depressed";

(c) a first loader constructed and connected to, at the end of each scan of the keyboard:
   (1) load a "no key depressed" code into the holding register if the scan-status code indicates "no key has yet been depressed"; and
   (2) load a "multiple keys have been depressed" code into the holding register if the scan-status code indicates "multiple keys have been depressed";
(d) a second comparator constructed and connected to, at the end of each scan of the keyboard, and after the operation (if any) of the loader:
   (1) compare the hold-code with a valid-key code in a valid-key register;
   (2) actuate the below-recited debounce counter if the hold-code and the valid-key code are different;
   (3) after the operation (if any) of the debounce counter, load a current-scan code from a current-scan field of the scan-status register to a previous-scan field of the scan-status register, thereby overwriting a previous-scan code in the previous-scan field;
   (4) after the loading of the current-scan code into the previous-scan field, initiate a next scan of the keyboard;
(e) a debounce counter comprising a debounce-hold register and a down counter, the debounce-hold register containing a debounce-hold code, the debounce counter being constructed and connected to, upon actuation by the second comparator:
   (1) decrement the down counter if:
      (A) the current-scan code and the previous-scan code are both "no key has yet been depressed"; or
      (B) the current-scan code and the previous-scan code are both "multiple keys have been depressed"; or
      (C) the current-scan code is "single key depressed, same as last scan" and the previous-scan code is "single key depressed, same as last scan" or "single key depressed, different from last scan";
   (2) load the down counter with the debounce-hold code in all other cases; and
   (3) if the down counter reaches a pre-selected number, actuating a second loader to load the hold-code into the valid-key register.

2. The scanner of claim 1, wherein the first comparator and the second comparator are the same.

3. The scanner of claim 1, wherein the first loader and the second loader are the same.

4. The scanner of claim 2, wherein the first loader and the second loader are the same.

5. The scanner of claim 1, wherein down counter is constructed and connected for the reaching of the pre-selected number to produce an interrupt signal.

6. The scanner of claim 2, wherein down counter is constructed and connected for the reaching of the pre-selected number to produce an interrupt signal.

7. The scanner of claim 3, wherein down counter is constructed and connected for the reaching of the pre-selected number to produce an interrupt signal.

8. The scanner of claim 4, wherein down counter is constructed and connected for the reaching of the pre-selected number to produce an interrupt signal.

* * * * *